United States Patent
Qian et al.

(10) Patent No.: US 7,251,376 B2
(45) Date of Patent: Jul. 31, 2007

(54) DATA COMPRESSION ENGINES AND REAL-TIME WIDEBAND COMPRESSOR FOR MULTI-DIMENSIONAL DATA

(75) Inventors: Shen-En Qian, Brossard (CA); Allan B. Hollinger, Toronto (CA); Luc Gagnon, Lachine (CA)

(73) Assignee: Canadian Space Agency, St. Hubert, Quebec (CA)

( * ) Notice: Subject to any disclaimer, the term of this patent is extended or adjusted under 35 U.S.C. 154(b) by 800 days.

(21) Appl. No.: 10/651,110

(22) Filed: Aug. 29, 2003

(65) Prior Publication Data

US 2005/0047670 A1   Mar. 3, 2005

(51) Int. Cl.
G06K 9/36 (2006.01)
G06K 9/46 (2006.01)

(52) U.S. Cl. .................................. 382/253
(58) Field of Classification Search .............. 382/253
See application file for complete search history.

(56) References Cited

U.S. PATENT DOCUMENTS

| 4,862,261 | A | * | 8/1989 | Tanaka ................... 348/422.1 |
| 5,255,090 | A | * | 10/1993 | Israelsen ................. 375/240.12 |
| 5,371,544 | A | * | 12/1994 | Jacquin et al. ......... 375/240.11 |
| 5,398,069 | A | | 3/1995 | Huang et al. |
| 6,167,156 | A | * | 12/2000 | Antoniades et al. ........ 382/232 |
| 6,320,907 | B1 | * | 11/2001 | Pau et al. .............. 375/240.22 |
| 6,546,146 | B1 | * | 4/2003 | Hollinger et al. ........... 382/253 |
| 6,650,256 | B2 | * | 11/2003 | Kondo et al. ................. 341/50 |
| 6,701,021 | B1 | | 3/2004 | Qian et al. |
| 6,898,326 | B2 | * | 5/2005 | Washizawa ................. 382/253 |

FOREIGN PATENT DOCUMENTS

EP   1 209 627   5/2002

OTHER PUBLICATIONS

Gersho et al; Vector and Signal Compression; Kluwer Academic Publishers, 1992, p. 451.

* cited by examiner

Primary Examiner—Wenpeng Chen
Assistant Examiner—Yuzhen Ge
(74) Attorney, Agent, or Firm—Cassan MacLean

(57) ABSTRACT

The present invention relates to a real-time wideband compressor for multi-dimensional data. The compressor comprises a plurality of compression engines for simultaneously compressing a plurality of data subsets of a set of input data vectors and providing compressed data thereof using one of SAMVQ or HSOCVQ data compression. Each compression engine comprises an along spectral vectors codevector trainer as well as an across spectral bands codevector trainer. The compression engines are programmable to perform either along spectral vectors codevector training or across spectral bands codevector training in combination with one of the SAMVQ or HSOCVQ techniques without changing hardware. The compressor further comprises a network switch for partitioning the set of input data vectors into the plurality of data subsets, for providing each of the plurality of data subsets to one of the plurality of compression engines, and for transmitting the compressed data. The real-time wideband compressor is highly advantageous in, for example, space applications by programmable enabling performance of different techniques of codevector training as well as different techniques of VQ. Furthermore, after the compression process is started the compression process is performed autonomously without external communication.

14 Claims, 13 Drawing Sheets

SAMVQ Overall Process

DATA COMPRESSION ENGINES AND REAL-TIME WIDEBAND COMPRESSOR FOR MULTI-DIMENSIONAL DATA

FIELD OF THE INVENTION

The invention relates to data compression and more particularly to a compressor for compressing a continuous flow of multidimensional data in real-time using vector quantization.

BACKGROUND OF THE INVENTION

The next generation of satellite-based remote sensing instruments will produce an unprecedented volume of data. Imaging spectrometers, also known as hyper-spectral imagers, are prime examples. They collect image data in hundreds of spectral bands simultaneously from the near ultraviolet to the short wave infrared, and are capable of providing direct identification of surface materials.

Hyper-spectral data thus collected are typically in the form of a three-dimensional (3D) data cube. Each data cube has two dimensions in the spatial domain defining a rectangular plane of image pixels, and a third dimension in the spectral domain defining radiance levels of multiple spectral bands per each image pixel. The volume and complexity of hyper-spectral data present a significant challenge to conventional transmission and image analysis methods.

Data compression using Vector Quantisation (VQ) has received much attention because of its promise of high compression ratio and relatively simple structure. The VQ procedure is known to have two main steps: codebook generation and codevector matching. VQ can be viewed as mapping a large set of vectors into a small set of indexed codevectors forming a codebook. During encoding, a search through a codebook is performed to find a best codevector to express each input vector. The index or address of the selected codevector in the codebook is stored associated with the input vector or the input vector location. Given two systems having a same codebook, transmission of the index to a decoder over a communication channel from the first system to the second other system allows a decoder within the second other system to retrieve the same codevector from an identical codebook. This results in a reconstructed approximation of the corresponding input vector. Compression is thus obtained by transmitting the index of the codevector rather the codevector itself.

In an article entitled "Lossy Compression of Hyperspectral Data Using Vector Quantization" by Michael Ryan and John Arnold in the journal Remote Sens. Environ., Elsevier Science Inc., New York, N.Y., 1997, Vol. 61, pp. 419-436, an overview of known general vector quantization techniques is presented. The article is herein incorporated by reference. In particular, the authors describe issues such as distortion measures and classification issues arising from lossy compression of hyper-spectral data using vector quantization.

Two innovative data compression techniques have been recently disclosed by the same inventor in U.S. patent application Ser. No. 09/717,220 filed 22 Nov. 2000 issued as U.S. Pat. No. 6,701,021 and in U.S. patent application Ser. No. 09/725,370 filed 24 Nov. 2000 issued as U.S. Pat No. 6,724,940, which are incorporated herein by reference. Both compression techniques—Successive Approximation Multi-Stage Vector Quantization (SAMVQ) and Hierarchical Self-Organizing Cluster Vector Quantization (HSOCVQ), respectively—are capable to provide near-lossless data compression if a fidelity threshold parameter is set to a value such that the error induced during the compression is at the same level of the intrinsic noise of the original data.

However, implementation of a lossy compression method for real-time data compression of a continuous data flow is substantially complicated due to the fact that the complete hyper-spectral data cube is not available for compression. In real-time compression onboard a satellite, hyper-spectral data corresponding to only a 2D focal plane frame sensed at a given moment from a swath target—across track line—on ground is available together with the hyper-spectral data corresponding to 2D focal plane frames sensed before. One—spatial-dimension of the 2D focal plane frame corresponds to a line of ground samples—called ground pixels, and another dimension of the 2D focal plane frame corresponds to a spectrum expansion of each ground pixel in wavelength. The spectrum expansion of a ground pixel is referred to as a "spectral vector". A focal plane frame comprises a same number of spectral vectors and ground pixels. The second spatial dimension of the hyper-spectral data cube is obtained by sensing successive swath targets in along-track direction of the moving satellite producing successive 2D focal plane frames.

Therefore, it is only possible to apply the compression to successive 2D focal plane frames or successive regions comprising several 2D focal plane frames substantially inhibiting successful application of lossy compression at high compression ratios. Application of conventional lossy compression methods on a region-by-region basis results in visible artifacts at the boundaries between the regions severely affecting image quality after decompression.

Furthermore, for real-time compression of a continuous hyper-spectral data flow, it is necessary to increase data throughput by using parallel operation of a plurality of compression engines. Therefore, a regional data cube is split into a plurality of smaller regional sub-cubes, referred to as vignettes herein. However, when a regional data cube is split into vignettes and each vignette is processed independently, a spatial boundary is introduced between two adjacent vignettes resulting in visible artifacts after decompression.

In U.S. patent application Ser. No. 10/606,761 filed Jun. 27, 2003 issued as U.S. Pat. No. 6,798,360 and U.S. patent application Ser. No. 10/611,897 filed Jul. 03, 2003 published as U.S. Patent Pub. No. 20050002584, which are incorporated herein by reference, the same inventor discloses compression techniques for compressing a continuous data flow in real time also enabling data compression using parallel operation of a plurality of compression engines. These innovative techniques overcome the above problems of real time data compression and allow implementation of SAMVQ as well as HSOCVQ.

Therefore, these techniques support a successful realization of a real-time wideband compression system.

SUMMARY OF THE INVENTION

It is, therefore, an object of the present invention to provide a real-time wideband compression system.

It is further an object of the present invention to provide a hardware implementation of real-time data compression techniques.

It is yet further an object of the present invention to provide a real-time wideband compression system comprising a plurality of compression engines.

The real-time wideband compressor is highly advantageous in, for example, space applications by programmable enabling performance of different techniques of codevector training as well as different techniques of VQ. Furthermore, after the compression process is started the compression process is performed autonomously without external communication. The compressor comprises a plurality of compression engines for simultaneously compressing a plurality of data subsets of a set of input data vectors and providing compressed data thereof using one of SAMVQ or HSOCVQ data compression. Each compression engine comprises an along spectral bands codevector trainer as well as an across spectral bands codevector trainer. The compression engines are programmable to perform either along spectral bands codevector training or across spectral bands codevector training in combination with one of the SAMVQ or HSOCVQ techniques without changing hardware. The compressor further comprises a network switch for partitioning the set of input data vectors into the plurality of data subsets, for providing each of the plurality of data subsets to one of the plurality of compression engines, and for transmitting the compressed data.

In accordance with the present invention there is provided, a codevector trainer comprising:

an input data vector memory for storing a plurality of input data vectors therein; a codevector memory for storing j codevectors therein;

i×j vector distance calculating units forming an array of i rows and j columns, the i×j vector distance calculating units being in data communication with the input memory and the codevector memory, the i×j vector distance calculating units for performing the steps of:
  a) receiving one component of each of i input data vectors from the input data vector memory and one component of each of the j codevectors from the codevector memory, the components corresponding to a same dimension within the vectors;
  b) determining i×j vector component distances corresponding to i×j combinations of the i input data vectors and the j codevectors;
  c) summing the successive i×j vector component distances such that each of the successive i×j vector component distances is added in a respective vector distance calculating unit of the i×j vector distance calculating units in order to determine i×j scalar vector distances; and,
  d) repeating the steps a), b) and c) for successive components;
  e) accumulating the i input data vectors in j partitions, the j partitions corresponding to the j codevectors, the i input data vectors being accumulated in dependence upon their assignment to one of the j partitions;
and,
a control unit in data communication with the input data vector memory, the codevector memory, and the i×j vector distance calculating units for performing the steps of:
  controlling provision of the components of the input data vectors and the codevectors to the respective vector distance calculating units;
  determining a best match codevector for each of the i input data vectors in dependence upon the scalar vector distances;
  assigning each of the i input data vectors to one of the j partitions in dependence upon the best match codevector; and,
  updating the codevectors in dependence upon the accumulated input data vectors associated with j partitions.

In accordance with the present invention there is further provided, a compression engine comprising:

an input data vector memory for storing a plurality of input data vectors therein;

a codevector memory for storing N codevectors therein;

a vector distance calculator for determining a vectored form of a distance between an input data vector and a codevector provided thereto;

a scalar distance block for receiving the vectored form of the distance and for summing vector components of the distance in order to provide a scalar distance;

a minimal distance selector block for determining a minimum scalar distance between an input vector and the N codevectors;

N vector accumulators, each of the N vector accumulators for receiving the input data vectors associated with one of the N codevectors based upon the minimum scalar distance and for accumulating the received input data vectors;

a codebook update process block for updating the N codevectors based upon the accumulated input data vectors; and, an exit criteria block for determining a termination of the codevector training process based upon the minimum scalar distances and a predetermined threshold.

In accordance with the present invention there is further provided, a compression engine comprising:

an input port for receiving input data vectors;

an output port for providing codevectors and an index map;

volatile memory in data communication with the input port and the output port for storing the input data vectors, the codevectors and the index map;

a codevector trainer in data communication with the volatile memory for training codevectors in dependence upon the input data vectors using one of along vector components codevector training or across vector components codevector training; and, a controller in communication with the codevector trainer and the volatile memory for executing in cooperation with the codevector trainer one of SAMVQ or HSOCVQ data compression in order to produce compressed data comprising the codevectors and the index map.

In accordance with the present invention there is further provided, a compressor comprising:

a plurality of compression engines for simultaneously compressing a plurality of data subsets of a set of input data vectors and providing compressed data thereof using one of SAMVQ or HSOCVQ data compression;

an input port for receiving the set of input data vectors;

an output port for providing the compressed data;

a network switch in data communication with the input port, the output port, and the plurality of compression engines, the network switch for performing the steps of:

partitioning the set of input data vectors into the plurality of data subsets;

providing each of the plurality of data subsets to one of the plurality of compression engines; and, transmitting the compressed data.

In accordance with an aspect of the present invention there is provided, a method for codevector training comprising the steps of:
  a) receiving at an array of i rows and j columns of vector distance calculating units one component of each of i input data vectors and one component of each of j codevectors, the components corresponding to a same dimension within the vectors;

b) using the array of vector distance calculating units determining i×j vector component distances corresponding to i×j combinations of the i input data vectors and the j codevectors;

c) summing the successive i×j vector component distances such that each of the successive i×j vector component distances is added in a respective vector distance calculating unit of the i×j vector distance calculating units in order to determine i×j scalar vector distances;

d) repeating the steps a), b) and c) for successive components;

e) determining a best match codevector for each of the i input data vectors in dependence upon the scalar vector distances;

f) assigning each of the i input data vectors to one of j partitions in dependence upon the best match codevector, the j partitions corresponding to the j codevectors;

g) using the array of vector distance calculating units accumulating the i input data vectors in the j partitions in dependence upon their assignment; and, h) updating the codevectors in dependence upon the accumulated input data vectors associated with j partitions.

In accordance with an aspect of the present invention there is provided, a method for codevector training comprising the steps of:

a) receiving at a vector distance calculator an input data vector of a plurality of input data vectors and one codevector of N codevectors;

b) using the vector distance calculator determining a vectored form of a distance between the input data vector and the codevector;

c) summing the vector components of the distance in order to provide a scalar distance;

d) repeating steps a) to c) for determining N scalar distances between the input data vector and the N codevectors, respectively;

e) determining a minimum scalar distance between the input data vector and the N codevectors;

f) providing the input data vector to one of N vector accumulators associated with the codevector having the minimum scalar distance to the input data vector;

g) repeating steps a) to f) for each of the plurality of input data vectors;

h) accumulating the respective input data vectors in each of the N vector accumulators;

i) updating the N codevectors based upon the accumulated input data vectors; and, j) repeating steps a) to i) until the minimum scalar distances meet predetermined criteria.

BRIEF DESCRIPTION OF THE DRAWINGS

Exemplary embodiments of the invention will now be described in conjunction with the drawings in which:

FIG. 3b is a simplified block diagram illustrating the memory arrangement of the along spectral bands vector distance calculator shown in FIG. 3a;

FIG. 4b is a simplified block diagram illustrating the memory arrangement of the across spectral bands vector distance calculator shown in FIG. 4a;

DETAILED DESCRIPTION OF THE INVENTION

The real-time wideband compressor according to the invention will be explained in connection with applications in satellite hyperspectral imagery. However, from the following description it will become apparent to those of skill in the art that employment of the compressor is not limited thereto but is highly beneficial in numerous other applications such as medical imaging.

In data compression of satellite hyperspectral imagery data the spectrum of a ground sample pixel—typically comprising 200 bands covering a range of wavelength between 0.4 and 2.5 μm—is described in vector form in order to apply a VQ technique. Such a vector is referred to as a spectral vector herein. Vectors determined through a training process from these spectral vectors are referred to as codevectors herein. An entire set of codevectors is called a codebook.

In the following, the architecture of the real-time wideband compressor according to the invention will be described starting with elementary hardware components and their subsequent integration into more complex components resulting in the final compressor architecture, i.e. vector distance calculators, codevector trainers, compression engines, and finally the compressor.

Vector distance calculation is the most frequent operation performed during codevector training for VQ based data compression. Both, the SAMVQ and the HSOCVQ technique, use either absolute distance or squared distance as vector distance measure. In the development of a real-time data compressor the implementation of the vector distance calculation is critical as it dominates the overall performance of the compressor. In the following, two hardware architectures—Along Spectral Bands Vector Distance Calculator and Across Spectral Bands Vector Distance Calculator—for determining vector distance according to the invention will be described.

Figure 1:
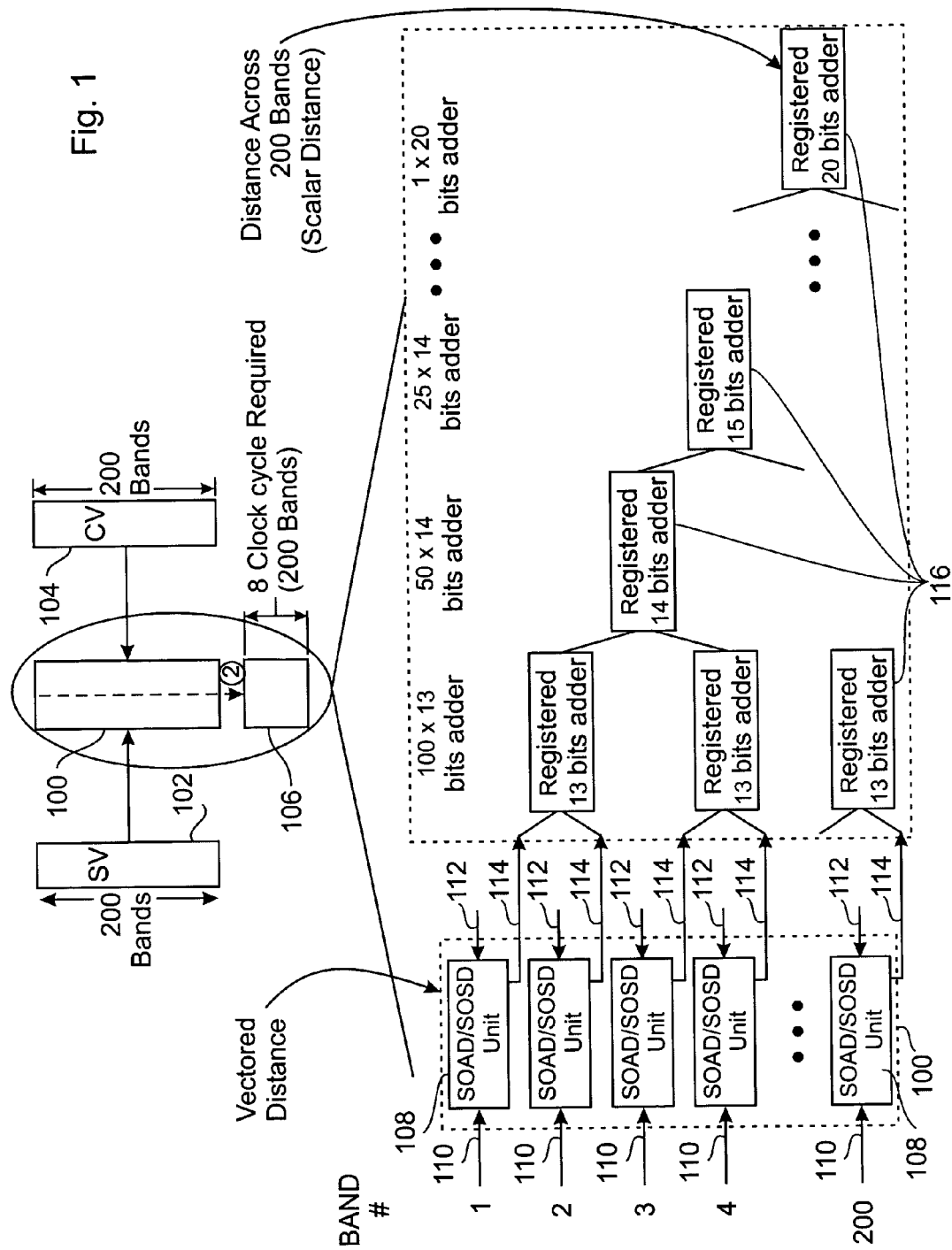
FIG. 1 is a simplified block diagram of an along spectral bands vector distance calculator according to the invention.

Referring to FIG. 1, a simplified block diagram of an Along Spectral Bands Vector Distance Calculator 100 according to the invention is shown. A spectral vector—in this example comprising 200 spectral bands—and a codevector are provided to the calculator 100 from a spectral vector memory 102 and a codevector memory 104, respectively. Each band 110 of the spectral vector and its corresponding component 112 of the codevector are provided to a respective Sum of Absolute/Squared Distance (SOAD/SOSD) unit 108 of the calculator 100. Each SOAD/SOSD unit 108 calculates a scalar distance 114—absolute or squared distance—between a spectral band of the spectral vector and its corresponding component of the codevector. The scalar distances 114 are then provided to a scalar distance block 109 comprising cascaded registered adders 116. For calculating the scalar distance 106 between a spectral vector having 200 spectral bands and a corresponding codevector having 200 components, the calculator 100 comprises 8 levels of registered adders 116 starting with 100 13 bit adders in the first level, followed by 50 14 bit adders in the second level, etc., as shown in FIG. 1. The last level comprises 1 20 bit adder providing the final scalar distance 106. The scalar distance 106 between the spectral vector and the codevector is obtained within a few clock cycles—8 clock cycles for 200 bands—upon entering the calculator 100, as all spectral bands of the spectral vector and all corresponding components of the codevector are processed in parallel.

The Along Spectral Bands Vector Distance Calculator 100 has the following advantageous features for processing hyperspectral data. A best match codevector is determined as soon as all the scalar distances 106 between the spectral vector and each of the codevectors have been calculated and compared. The codevector to which the spectral vector has a minimum scalar distance is the best match codevector for the spectral vector. The partition—referred to herein as a set of spectral vectors having a same best match codevector—to which the spectral vector belongs is known as soon as the best match codevector is determined. The index—i.e. address—of the best match codevector in the codebook is assigned to the spectral vector within a few clock cycles. The index is the compression output of the spectral vector following the last iteration of the codevector training process.

Further, the Along Spectral Bands Vector Distance Calculator 100 supports pipeline processing operations to support a distance calculation per clock cycle, when desired, with a latency as indicated above. In the pipeline processing mode of operation, it is advantageous to provide a shift register for cascading an index associated with the codevector such that the output scalar distance 106 and a corresponding codevector index are provided at output ports simultaneously. Thus, to determine a best match, each scalar distance 106 is compared to a previously calculated lowest scalar distance and when the scalar distance 106 is lower, it replaces the previously calculated lower scalar distance and an associated index value is stored. Once all codevectors have been provided to the Along Spectral Bands Vector Distance Calculator 100, the index stored is that of the best match codevector.

Figure 2:
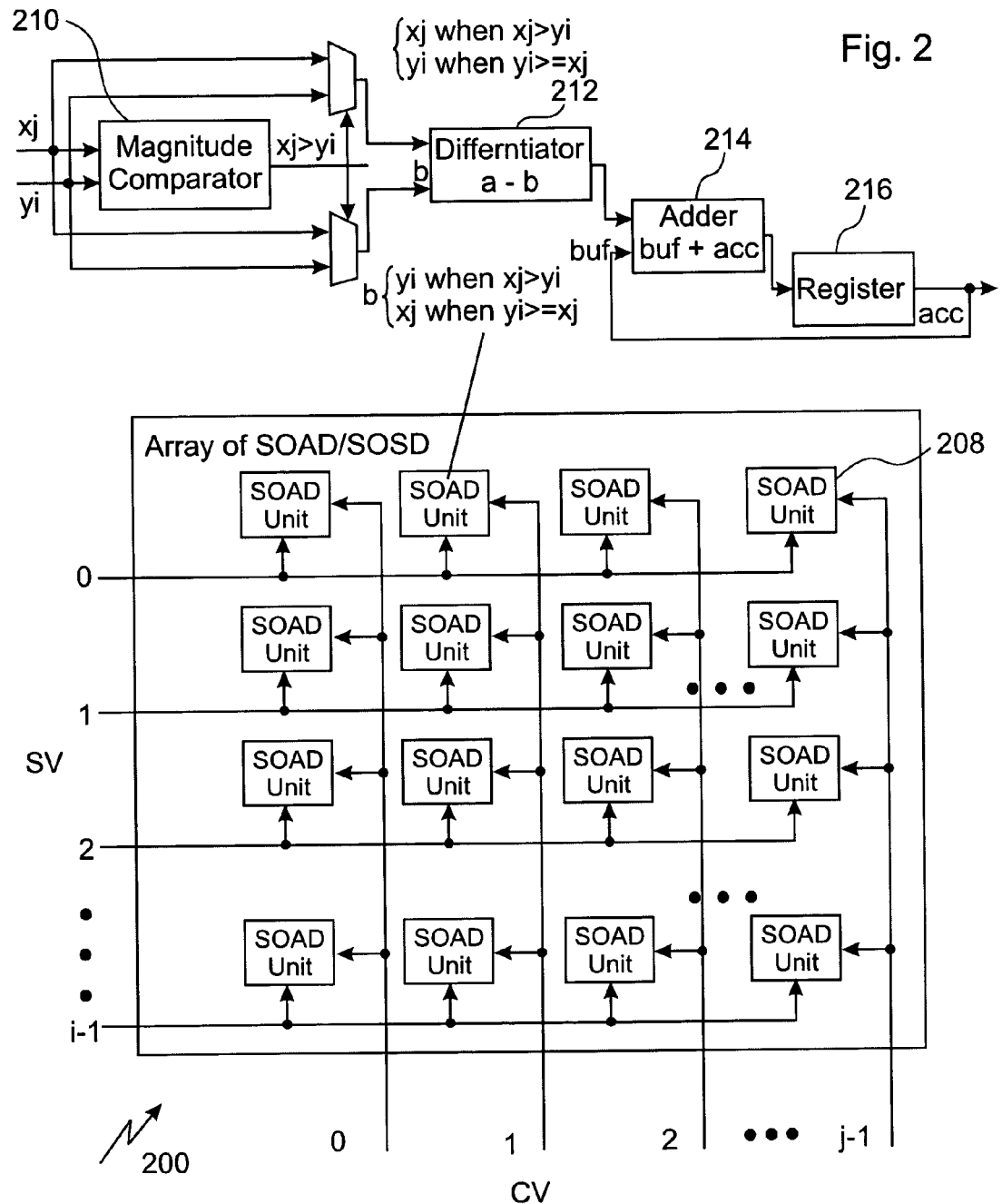
FIG. 2 is a simplified block diagram of an across spectral bands vector distance calculator according to the invention.

Referring to FIG. 2, a simplified block diagram of an Across Spectral Bands Vector Distance Calculator 200 according to the invention is shown. In the Across Spectral Bands Vector Distance Calculator 200, the vector distance calculation is realized on a spectral band by spectral band basis using a two—dimensional matrix architecture. The nodes of the matrix comprise vector distance calculating units such as SOAD/SOSD units 208 with each SOAD/SOSD unit 208 comprising a magnitude comparator 210, a differentiator 212, an adder 214, and a register 216, as shown in the detailed diagram of FIG. 2. In operation, a given spectral band of Spectral Vectors (SV) 0 to i−1 are provided to the SOAD/SOSD units 208 such that the spectral band of one spectral vector is provided to one row of the matrix. The component of Code Vectors (CV) 0 to j−1 corresponding to the given spectral band are provided to the SOAD/SOSD units 208 such that the corresponding component of one codevector is provided to one column of the matrix. Each SOAD/SOSD unit 208 determines a distance between the given spectral band of a spectral vector and the corresponding component of a codevector during a given clock cycle. The overall scalar distance—absolute/squared distance—between the two vectors is then obtained by repeating the process along the spectral bands. The architecture of the Across Spectral Bands Vector Distance Calculator 200 according to the invention provides for parallel processing for calculating vector distances. As shown in FIG. 2, a total of i×j vector component distances between i spectral vectors and j codevectors is determined per clock cycle. Each of the i spectral vectors has its best match codevector determined and is assigned an index after all elements of the spectral vectors in the along spectral bands direction are accumulated. In operation the Across Spectral Bands Vector Distance Calculator 200 uses fewer memory accesses and a smaller BUS width than the Along Spectral Bands Vector Distance Calculator 100. Spectral vector data corresponding to only one spectral band are fed to the SOAD/SOSD unit 208 at a given time. There is no need to save values relating to the spectral vectors after the vector distance calculation unless the scalar distance is the lowest. Furthermore, only one adder and one register is used to determine the scalar distance between two vectors—instead of 200 adders and registers in the Along Spectral Bands Vector Distance Calculator 100—since a vector distance is determined on a spectral band by spectral band basis. The vector distance is obtained by accumulating the component distances associated with the spectral bands. The Across Spectral Bands Vector Distance Calculator 200 is highly advantageous for hardware implementation since it substantially reduces hardware size and complexity. It ultimately increases the number of spectral vectors and codevectors being processed using, for example, a given FPGA/ASCI chipset within a compression engine.

The LBG process disclosed by Y. Linde, A. Buzo and R. M. Gray in: "An algorithm for vector quantizer designs", IEEE Trans. Commun. 28(1), 84-95, 1980, which is herein incorporated by reference, is a widely used vector-training process in VQ based data compression techniques. It is useful for both the SAMVQ and the HSOCVQ technique. In a real-time data compressor, the implementation of the LBG process critically impacts overall performance of the compression system. In accordance with the present invention, two hardware architectures based on the two Vector Distance Calculators disclosed are described. The two hardware embodiments are called Along Spectral Bands Codevector Trainer and Across Spectral Bands Codevector Trainer.

Figure 3A:
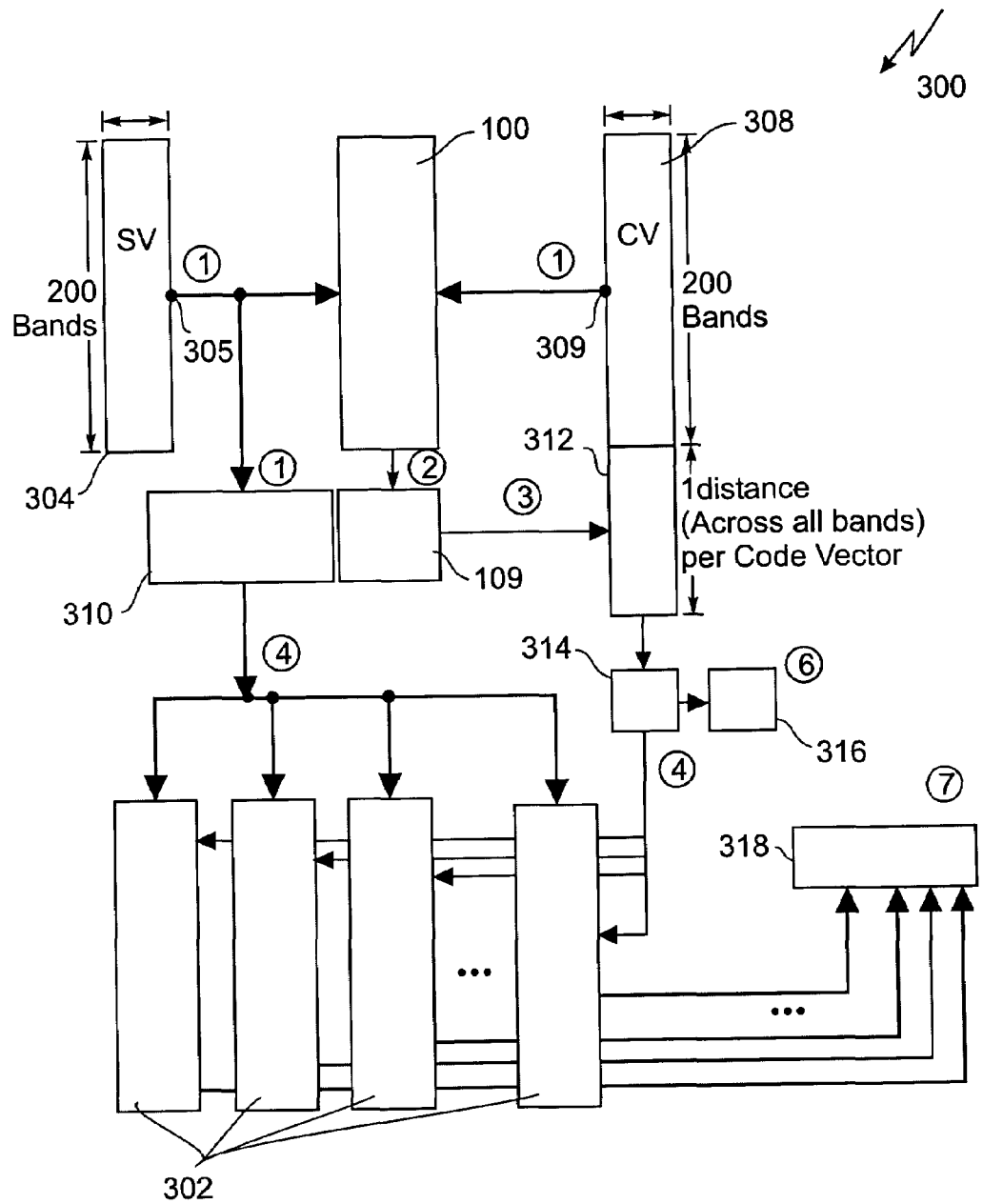
FIG. 3a is a simplified block diagram of an along spectral bands codevector trainer according to the invention.
Figure 3B:
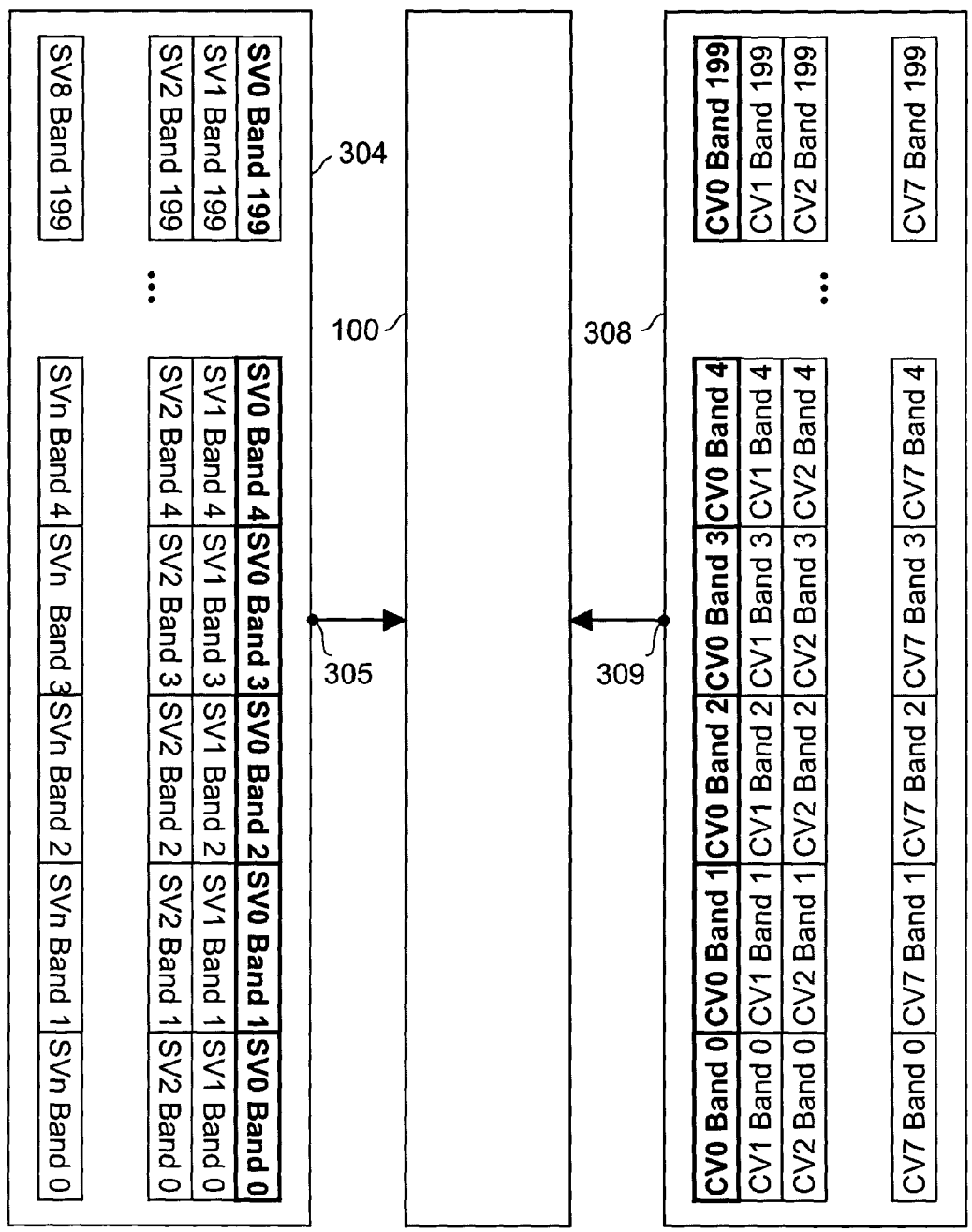

Referring to FIG. 3a, a simplified block diagram of an Along Spectral Bands Codevector Trainer 300 according to the invention is shown. The Along Spectral Bands Codevector Trainer 300 autonomously trains codevectors from the spectral vectors using the LBG process. The Codevector Trainer 300 comprises an Along Spectral Bands Vector Distance Calculator 100—shown in FIG. 1—, Vector Accumulators 302 for codebook update, Spectral Vector Memory 304, and Codevector Memory 308 as basic elements. Optionally, a different vector training process is implemented. The Spectral Vector Memory 304 contains the input data in form of spectral vectors, each spectral vector comprising, for example, 200 spectral bands. It is noted that a spectral vector is read completely during a single clock cycle, i.e. when a given spectral vector of the Spectral Vector Memory 304 is read, 200 spectral bands of, for example, 12 bits each resulting in 2400 bits is obtained. The input data corresponding to one spectral vector is provided to the Along Spectral Bands Vector Distance Calculator 100 for determining a vectored form of the squared distance or absolute distance to a codevector provided thereto, i.e. a vector comprising, for example, 200 distances between the 200 spectral bands of the spectral vector and 200 corresponding components of the codevector. The vectored form of the squared distance or absolute distance is then provided to a Scalar Distance Block 109. The Codevector Memory 308 contains, preferably, all N codevectors used in the compression, for example, N is 4, 8, or 16. Again a complete codevector comprising, for example, 200 components of 12 bits each is read during a single clock cycle. Referring to FIG. 3b a memory architecture accommodating the data provision to the Along Spectral Bands Vector Distance Calculator 100 is shown. As shown in FIG. 3b, all spectral bands of a spectral vector (SV) and all components of a codevector (CV) are readily available at output ports 305 and 309 of the SV memory 304 and the CV memory 308, respectively. Due to this specific architecture no other SV or CV is accessible while a given SV or CV is being accessed. Each memory output is dimensioned large enough to accommodate the provision of a complete vector—SV or CV—typically comprising 200 bands of 12 bits each, i.e. each output data being 2400 bits wide. Remember Register 310 is interposed between the SV memory 304, the Vector Distance Calculator 100, and the Vector Accumulators 302. The Remember Register 310 comprises a memory array equal in size to the spectral vector and serves as temporary storage for the spectral vector while the Scalar Distance between the spectral vector and all the codevectors is being determined. The Scalar Distance Block 109 receives the vectored form of the squared or absolute distance as an input value and sums, for example, its 200 vector components in order to provide a scalar distance between a given spectral vector and a codevector. Memory Area 312 is used for storing the scalar distances between a given spectral vector and all N codevectors successively provided by the Scalar Distance Block 109. The N scalar distances are then provided to a Minimal Distance Selector Block 314 for determining a codevector closest to the given spectral vector, i.e. the codevector corresponding to the minimum scalar distance. Based upon the determined codevector the Minimal Distance Selector Block 314 determines associated Vector Accumulator 302 for accumulating the given spectral vector therein. Exit Criteria Block 316 receives the minimal scalar distances determined for all spectral vectors of the input data and determines the end of the codevector training process based upon predetermined criteria. The N=4, 8, or 16 Vector Accumulators 302 comprise specialized adders for summing all the spectral vectors associated with a given codevector. Each Vector Accumulator 302 has as many adders as the number of spectral bands in a spectral vector. The output from the Vector Accumulators 302 is then provided to Codebook Update Process Block 318. The codevectors are updated in the Codebook Update Process Block 318 by dividing the accumulated spectral vectors of the partitions by the number of the accumulated spectral vectors—entry count—in each of the partitions and the updated codevectors are then provided to the CV Memory 308 for a following iteration step. Due to the architecture of the Along Spectral Bands Vector Distance Calculator 100, the distance between a spectral vector and a codevector is available within a few clock cycles. For each spectral vector in the SV Memory 304, the best match codevector in the codebook is found by serially determining the distance to each of the codevectors—typically 8. The time consuming codevector update operation is conducted in parallel with the training process since the partition associated with the closest codevector is already known. The spectral vector is sent to the respective Vector Accumulator 302 and summed. The codevector update function is substantially completed when all the spectral vectors in the SV Memory 304 have been processed. The remaining operation is normalization which divides the spectral vector in each Vector Accumulator 302 by the number of members in the partition—entry count—to obtain the updated codevector for the associated partition, which is then used in the next iteration step. All hardware units of the Along Spectral Bands Codevector Trainer 300 are accommodated within a single IC such as a FPGA. There is no need for external communication once all the data are fed to the Trainer 300 at the beginning of the training process. This self contained implementation of the training process significantly reduces the time required for communication and data transfer.

Figure 4A:
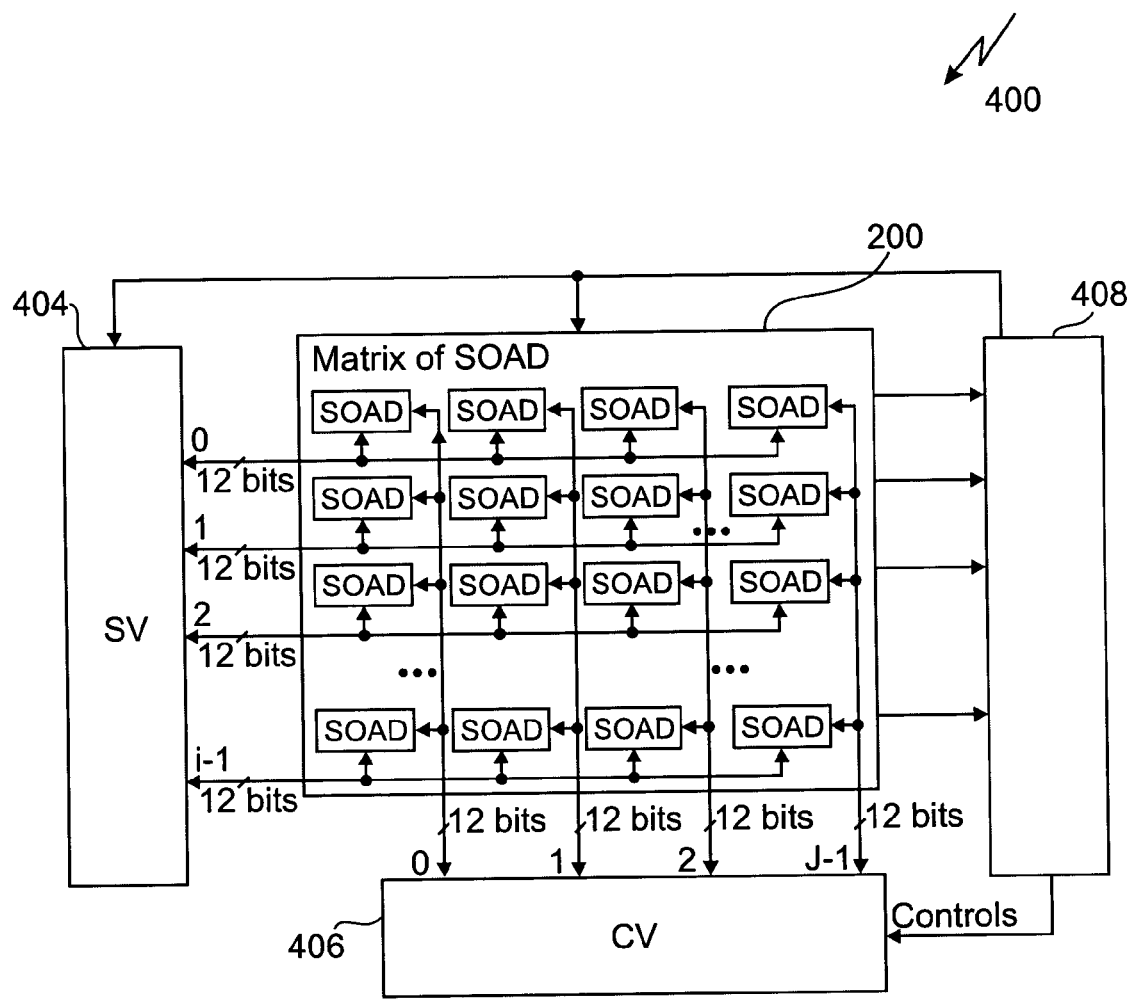
FIG. 4a is a simplified block diagram of an across spectral bands codevector trainer according to the invention.
Figure 4B:
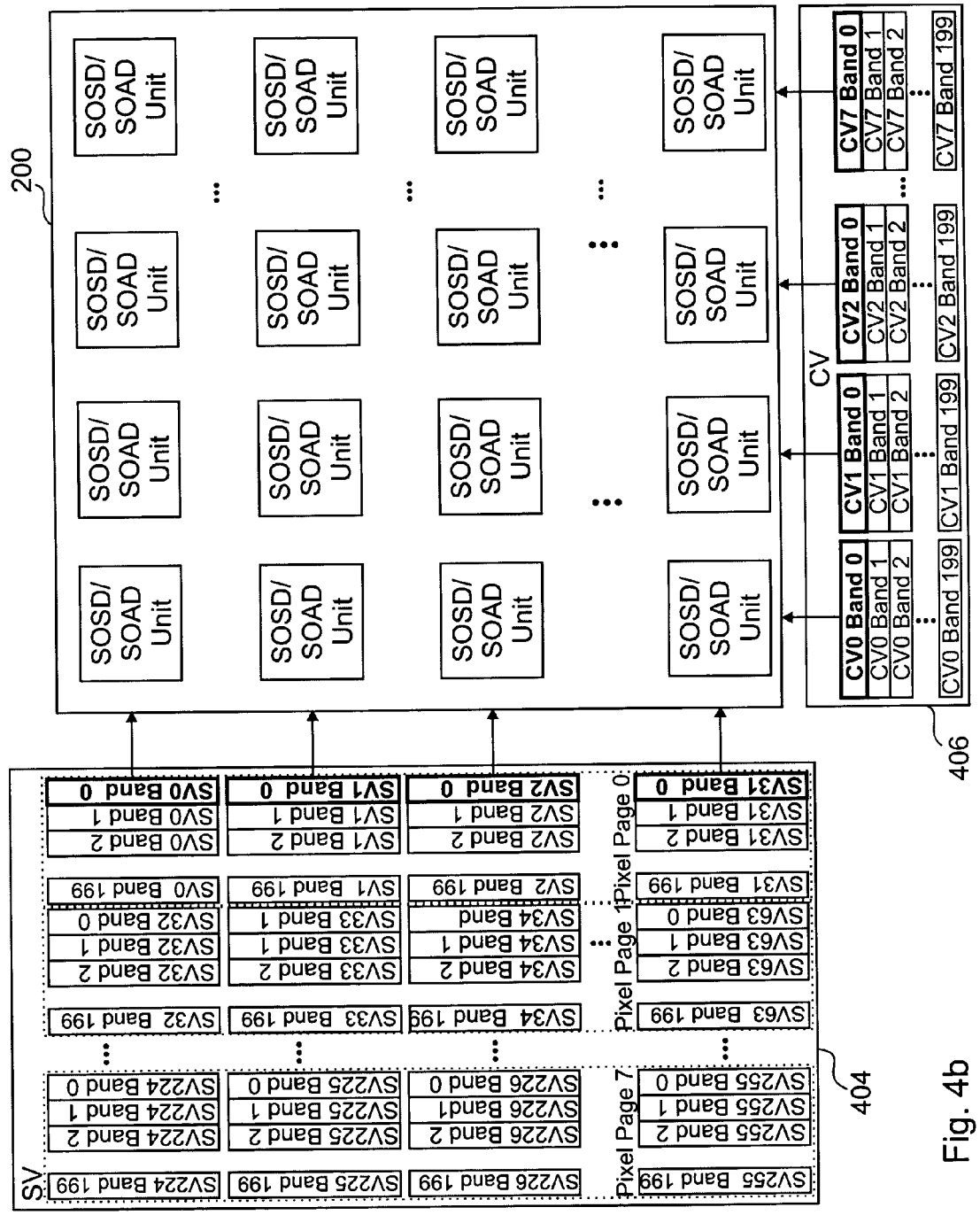

Referring to FIG. 4a a simplified block diagram of an Across Spectral Bands Codevector Trainer 400 according to the invention is shown. The Across Spectral Bands Codevector Trainer 400 autonomously trains codevectors from the spectral vectors using the LBG process. The Codevector Trainer 400 comprises an Across Spectral Bands Vector Distance Calculator 200—as shown in FIG. 2—, Spectral Vector Memory 404, Codevector Memory 406 and Control Unit 408. Optionally, a different vector training process is implemented within a different Control Unit of the Codevector Trainer. The Spectral Vector Memory 404 contains the input data in form of spectral vectors, each spectral vector comprising, for example, 200 spectral bands. Due to the matrix architecture of the Across Spectral Bands Vector Distance Calculator 200, the Codevector Trainer 400 calculates multiple vector distances simultaneously on a spectral band by spectral band basis. The number of codevectors to be trained is usually in a range of 4 to 16 codevectors, which are accommodated in the columns of the Across Spectral Bands Vector Distance Calculator 200. The number of spectral vectors residing in the SV Memory 404 is usually larger than the number of rows of the Across Spectral Bands Vector Distance Calculator 200. Therefore, the total number of spectral vectors stored in the SV Memory 404 is grouped into pages of i spectral vectors. The pages are then processed successively in the Across Spectral Bands Vector Distance Calculator 200. As shown in FIG. 4b, the SV Memory 404 provides a spectral band corresponding to a same dimension within the spectral vectors for the i spectral vectors, and the CV Memory 406 provides the corresponding component of the j codevectors. Therefore, the SV Memory 404 has a memory output width equal to the number of spectral vectors being read simultaneously multiplied by the sample width, i.e. 384 bits for 32 rows—spectral vectors—and 12 bits per band. Accordingly, the CV Memory 406 has a memory output width equal to the number of codevectors multiplied by the sample width, i.e. 48, 96, or 192 bits for 4, 8, or 16 codevectors, respectively. With each clock cycle i×j vector distances for a given spectral band are determined and added to the sum of previously determined vector component distances. This process is repeated along spectral bands until the last spectral band of the spectral vectors is processed and i×j final scalar vector distances for the combination of i spectral vectors and j codevectors are obtained. With the i×j scalar vector distances determined, a best match codevector is determined for each spectral vector of the current page using Control Unit 408. Using Control Unit 408, indexes of the best match codevectors are then assigned to the spectral vectors. The above process is then repeated for all pages. In a following step the SOAD/SOSD matrix of the Vector Distance Calculator 200 is used to accumulate the spectral vectors for each partition, with each partition corresponding to a codevector. The indexes assigned to the spectral vectors are used in order to identify the partition to which a spectral vector belongs. Thus, spectral vectors of a given page having a same index are accumulated on a spectral band by spectral band basis in a same column of the matrix. The accumulation of the spectral vectors is repeated until all of the pages are processed. The remaining operation is normalization which divides the vector in each partition by the number of members in the partition—entry count—to obtain the updated codevector for the associated partition, which is then used in the next iteration step. The assignment of a spectral vector to a respective partition, the entry count, and the normalization are performed using the Control Unit 408. Furthermore, the end of the codevector training process is determined based upon predetermined exit criteria using the Control Unit 408. In the present embodiment, all hardware units are accommodated within a single IC such as a FPGA. There is no need for external communication after the input data are fed at the beginning of the training process. This self-contained implementation significantly reduces time for communication and data transfer.

Figure 5:
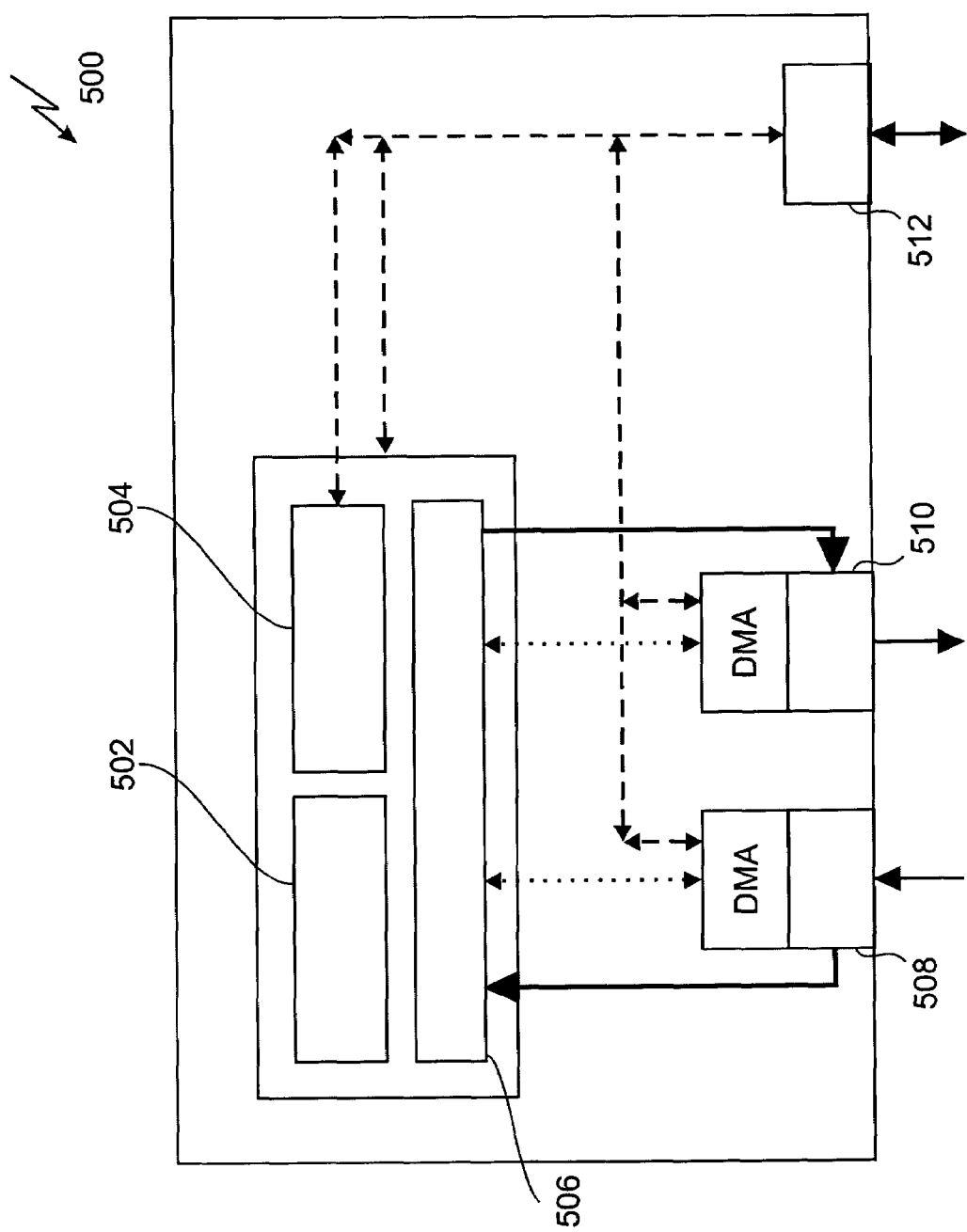
FIG. 5 is a simplified block diagram of a compression engine according to the invention.

Referring to FIG. 5, a Compression Engine (CE) 500 according to the invention is shown. The CE 500 comprises a Codevector Trainer 502, a State Machine Controller 504, an Internal RAM 506, two Direct Memory Access (DMA) Interfaces 508 and 510, and a Programming Bus Interface 512. Dashed lines indicate Programming Bus, thin continuous lines indicate Request or Handshake Lines, thick continuous lines indicate Data Buses. In a preferred embodiment of the CE 500 the Codevector Trainer 502 is implemented as Along Spectral Bands Codevector Trainer—shown in FIG. 3a—as well as Across Spectral Bands Codevector Trainer—shown in FIG. 4a. The State Machine Controller 504 is designed such that the CE 500 performs either the SAMVQ or the HSOCVQ technique. Optionally, other VQ based data compression techniques are implemented in the CE 500. Further optionally, only one of the Codevector Trainer and/or VQ technique are supported reducing complexity of the hardware implementation as well as programming at the cost of substantially reduced flexibility in data compression. The Programming Bus Interface 512 receives programming signal from a Network Switch for programming of the Codevector Trainer 502 and the Internal RAM 506 to support Along Spectral Bands Codevector Training or Across Spectral Bands Codevector Training as well as programming of the State Machine Controller 504 to perform either the SAMVQ technique or the HSOCVQ technique. Therefore, the CE 500 is capable of operating in one of the four combinations shown in Table 1 without changing the hardware.

TABLE 1

| SAMVQ | HSOCVQ |
|---|---|
| Along Spectral Bands | Along Spectral Bands |
| SAMVQ | HSOCVQ |
| Across Spectral Bands | Across Spectral Bands |

The DMA Interface 508 receives input spectral vectors from a Network Switch and transfers the same spectral vectors to the Internal RAM 506 at high speed. The DMA Interface 510 transfers the compressed data to the Network Switch. The DMA Interfaces 508 and 510 are connected via a High Speed Serial Link Pair Interface (LVDS) to the Network Switch for fast transfer of the input spectral vectors and the compressed data. The input spectral vectors are stored in the Internal RAM 506 prior to compression. Optionally, the Internal RAM 506 comprises the memory architectures shown in FIGS. 3b and 4b supporting Along Spectral Bands Codevector Training as well as Across Spectral Bands Codevector Training. The compressed data—codevectors and index map—are also stored in the Internal RAM 506 prior to transmission via DMA Interface 510. This enables the CE 500 to autonomously perform the compression process without external communication, substantially increasing processing speed. Only a few commands such as "feeding vectors" and "start compression" are needed to initiate the compression process. The completion of the compression process is signaled, for example, by a prompt. Furthermore, the CE 500 according to the invention is independent of a system clock of a system it is integrated therein. Once the input data are received, the compression process is performed using an internal clock. The Serial Links act to decouple the clock domains of the CE 500 and its environment. The Programming Bus Interface 512 is asynchronous and does not constrain the clock of the CE. All hardware units of the CE 500 are accommodated within a single IC such as a FPGA. The above features of the CE 500 according to the invention are highly advantageous, providing a CE that is fast, flexible without hardware changes, capable of autonomous operation and easy to control. Therefore, the CE 500 substantially facilitates formation of a parallel compression system.

Figure 6:
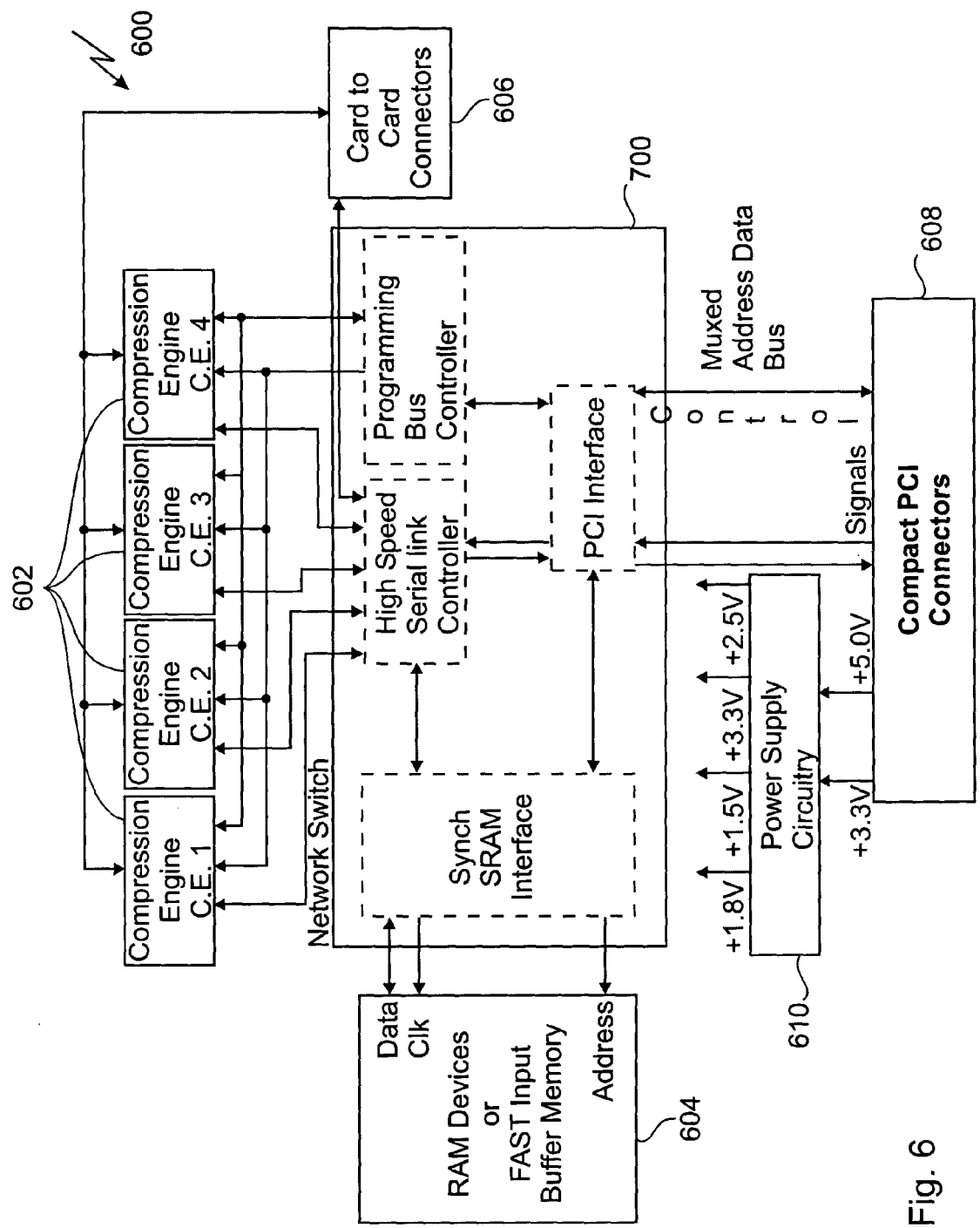
FIG. 6 is a simplified block diagram of a real-time wideband compressor according to the invention.

Referring to FIG. 6, a simplified block diagram of a real-time wideband compressor 600 according to the invention is shown. The basic components of the compressor 600 are a plurality of parallel CEs 602 such as shown in FIG. 5 and a high speed Network Switch 700. The network switch 700 distributes the input spectral vector data into each of the plurality of CEs 602 and receives and transmits resulting compressed data. The SAMVQ and HSOCVQ techniques disclosed by the inventor in U.S. patent application Ser. No. 09/717,220 filed 22 Nov. 2000, in U.S. patent application Ser. No. 09/725,370 filed 24 Nov. 2000, U.S. patent application Ser. No. 10/606,761 filed 27 Jun. 2003 and U.S. patent application Ser. No. 10/611,897 filed 03 Jul. 2003, which are incorporated herein by reference, support splitting of the input spectral vector data into sub-sets for simultaneously compressing the same using a plurality of CEs. An Input Buffer Memory 604—RAM—is connected to the Network Switch 700 via a 128 bit width data bus. The Input Buffer Memory 604 allows for multiple data-subsets to be stored and read at very high rates in order to avoid bottlenecks in the Serial Link Communication to the CEs. Preferably, the real-time wideband compressor 600 is built on a PCB board. The PCB enables high speed serial links between the network switch 700 and the CEs 602. Reconfigurable IC chipsets such as FPGAs connected to the PCB are preferably used, for example, one re-configurable IC for each of the parallel CEs and one re-configurable IC for the network switch. Thus, for example, allowing programming from a ground station of multiple configurations in real-time using a same hardware onboard a spacecraft. Furthermore, the PCB enables a serial link expansion of the network switch 700 to a second PCB via a communication link such as a card to card connector 606, i.e. doubling the number of CEs in the compressor. Using existing technology 4 CEs are implemented for simultaneous processing of four data-subsets on one PCB, or 8 CEs when 2 PCBs are linked. The compressor 600 is integrated into an application system environment and linked thereto via a communication link 608 such as Compact PCI Connectors for transmission of control signals, data, and power. The received power is transmitted via power supply circuitry 610 to the various components of the compressor. The hardware architecture shown in FIG. 6 and employment of PCBs and FPGAs provides the compressor with modularity allowing adaptation of the compressor to numerous system applications with minimal redesign. Another advantage of this design is cost reduction by using standard technology such as PCBs and FPGAs. Furthermore, use of PCBs and FPGAs enables implementation of debugging features into the compressor, which is highly beneficial in applications onboard a spacecraft.

Figure 7:
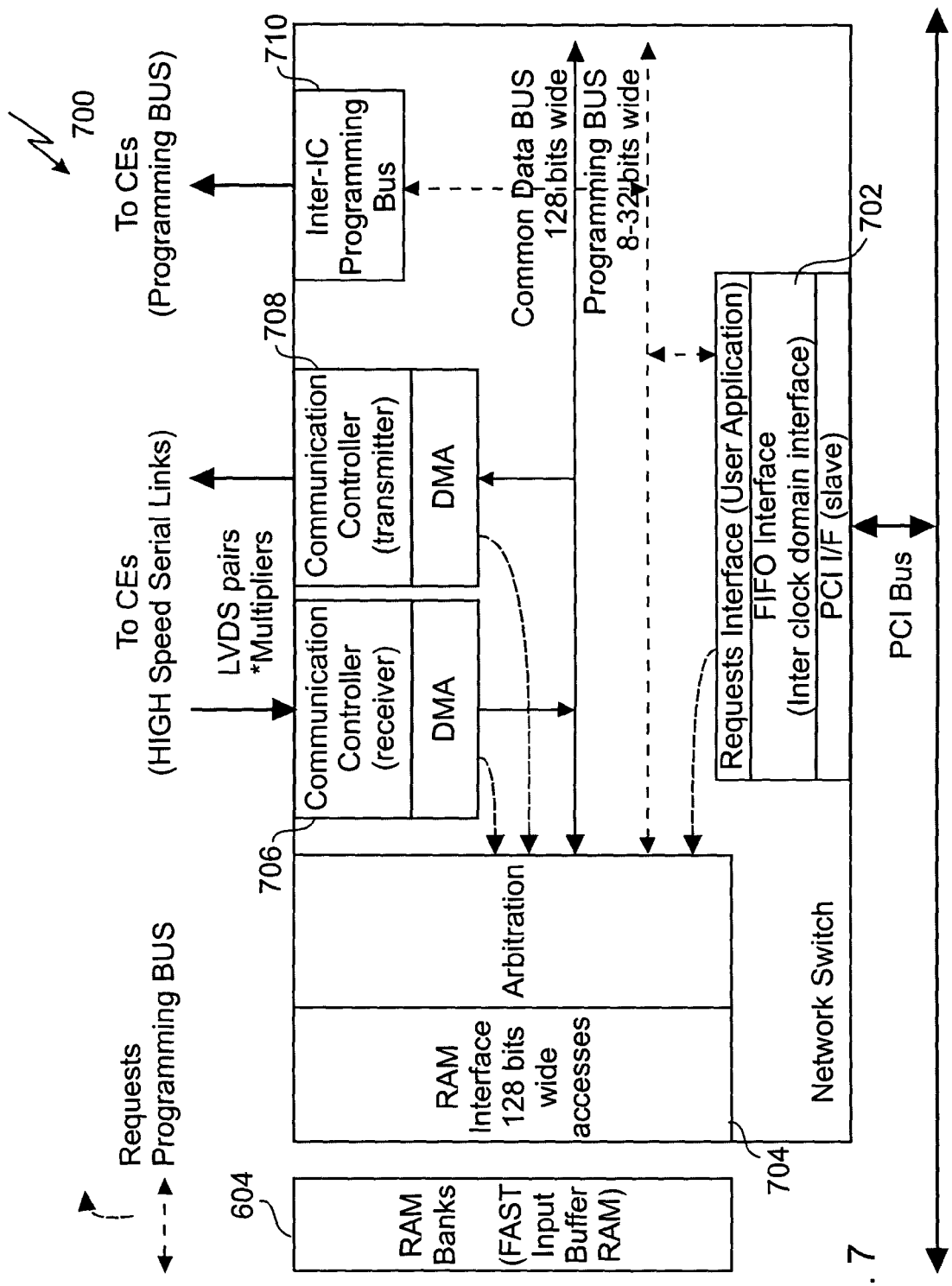
FIG. 7 is a simplified block diagram of a network switch of the real-time wideband compressor shown in FIG. 6.

Referring to FIG. 7, a more detailed block diagram of the Network Switch 700 according to the invention is shown. The Network Switch 700 is linked to the PCB via PCI Interface 702. The PCI Interface 702 comprises a programming bus link for configuring the CEs via a programming bus—thin dashed lines—of the Network Switch 700 and Inter IC Programming Interface 710 as well as for configuring the Input Buffer Memory 604 via RAM Interface 704. The PCI Interface 702 further comprises a PCI data link for transmission of input spectral vectors data and compressed output data. Data communication within the network switch 700 is enabled using a, for example, 128 bit wide common data bus—solid lines—connecting the PCI interface 702, the RAM interface 704, and DMA Interfaces 706 and 708. The DMA Interface 708 provides a high speed serial link to the CEs for provision of input data thereto. Accordingly, the DMA Interface 706 provides a high speed serial link to the CEs for receiving the compressed data from the CEs. In operation, the Network Switch 700 receives the input spectral vector data from PCI interface 702 and transmits the received data to the Input Buffer Memory 604 via the RAM Interface 704 for storage therein. In dependence upon received programming data, the input spectral vector data are then accessed and partitioned for distribution to the plurality of CEs using the RAM Interface 704. The partitioned input spectral vector data are then provided to the plurality of CEs via the common data bus and the DMA Interface 708. The compressed data are received from the plurality of CEs via the DMA Interface 706 and provided via the common data bus and the RAM Interface 704 to the Input Buffer Memory for storage therein. Alternatively, the received compressed data are directly transmitted to the PCI Interface 702. Employment of the RAM Interface 704 linked to the Input Buffer Memory 604 is highly advantageous for real-time data compression allowing receipt of input data during the compression process and provision of the same to the CEs via a high speed serial link, substantially increasing processing speed. Furthermore, partitioning and provision of the partitioned input data for simultaneous processing by a plurality of CEs is substantially facilitated using the Input Buffer Memory 604. Using currently available technology, the hardware implementation of the Network Switch 700 is realized using one IC such as a FPGA. It allows implementation of 8 CEs within one compressor. Furthermore, it is possible to add other functions such as a summing unit. The hardware architecture shown in FIGS. 6 and 7 allows direct connection of a hyperspectral sensor to the Network Switch 700 via a high speed serial link.

Figure 8:
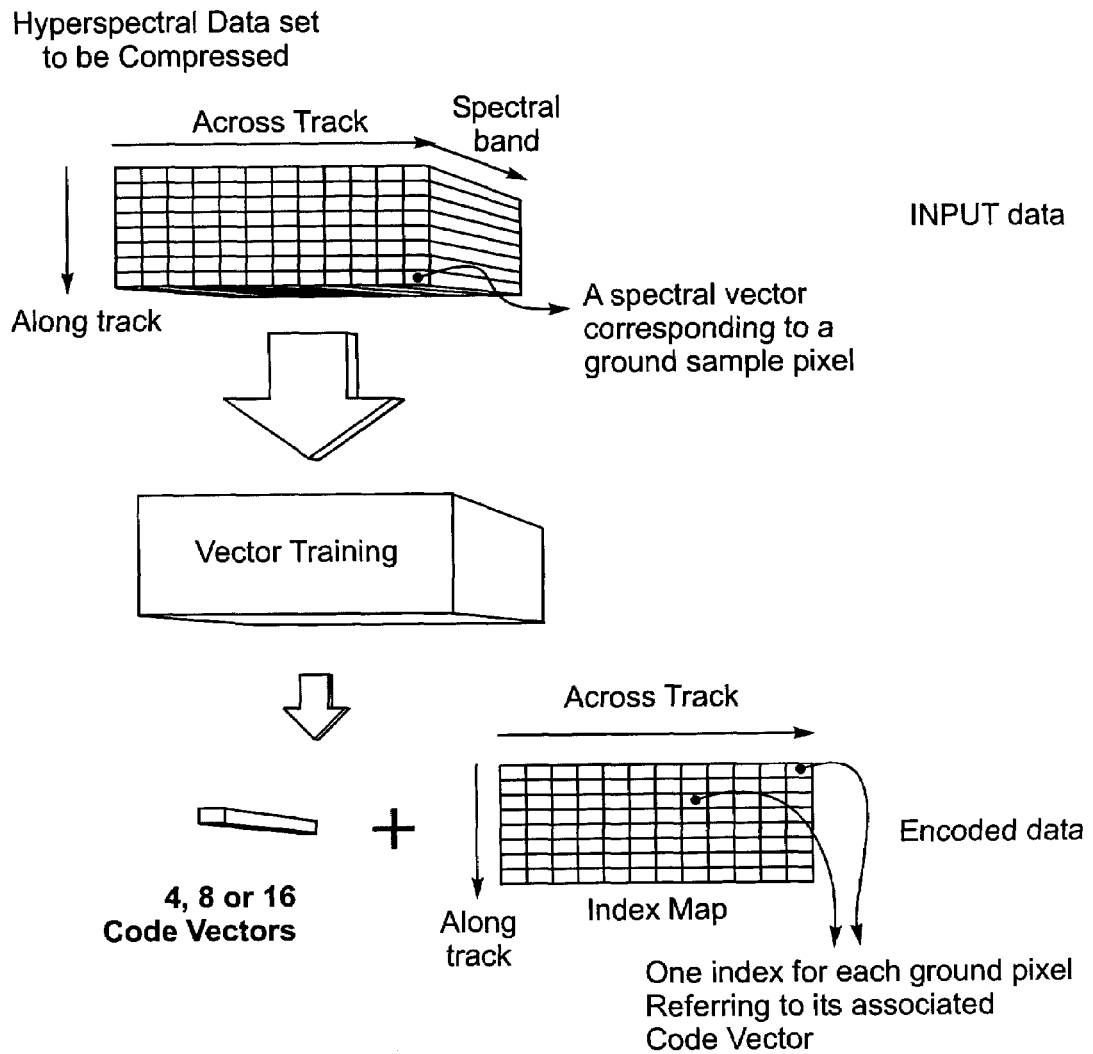
FIG. 8 is a simplified flow diagram illustrating a data compression process using vector quantization.

In the following, the SAMVQ and the HSOCVQ techniques are described as implemented in the above hardware architecture. Hereinbelow, the LBG process is used as the vector training process in both the SAMVQ and the HSOCVQ technique. It is an iterative vector training process that encodes a large number of Spectral Vectors (SV) into a reduced set of usually 4, 8, or 16 Code Vectors (CV) by which all input SVs are best encoded, as shown in FIG. 8.

The input data set comprises a 3D array of SVs. The output data set comprises a small set of CVs, which best encode the input SVs, and an output index map. The output index map is a 2D array corresponding to the two spatial dimensions of the array of the input data set. Each value in the index map refers to the best match CV by which the corresponding input SV is encoded. In order to determine the best CVs for encoding the input data set an iterative process referred to as "vector training process" is used. After completion of the vector training process the output data comprise a small set of CVs—4, 8, or 16—and an index map—a 2D array of "across track elements" by "along track elements." More approximation stages (SAMVQ) or cluster splittings (HSOCVQ) are required if the reconstruction fidelity of the compressed data is not better than a pre-determined threshold. These data are, for example, sent to ground. During decompression each index of the index map is replaced by its associated CV, referred to as an "encoded datacube," which is a very good representation of the original input datacube.

Figure 9:
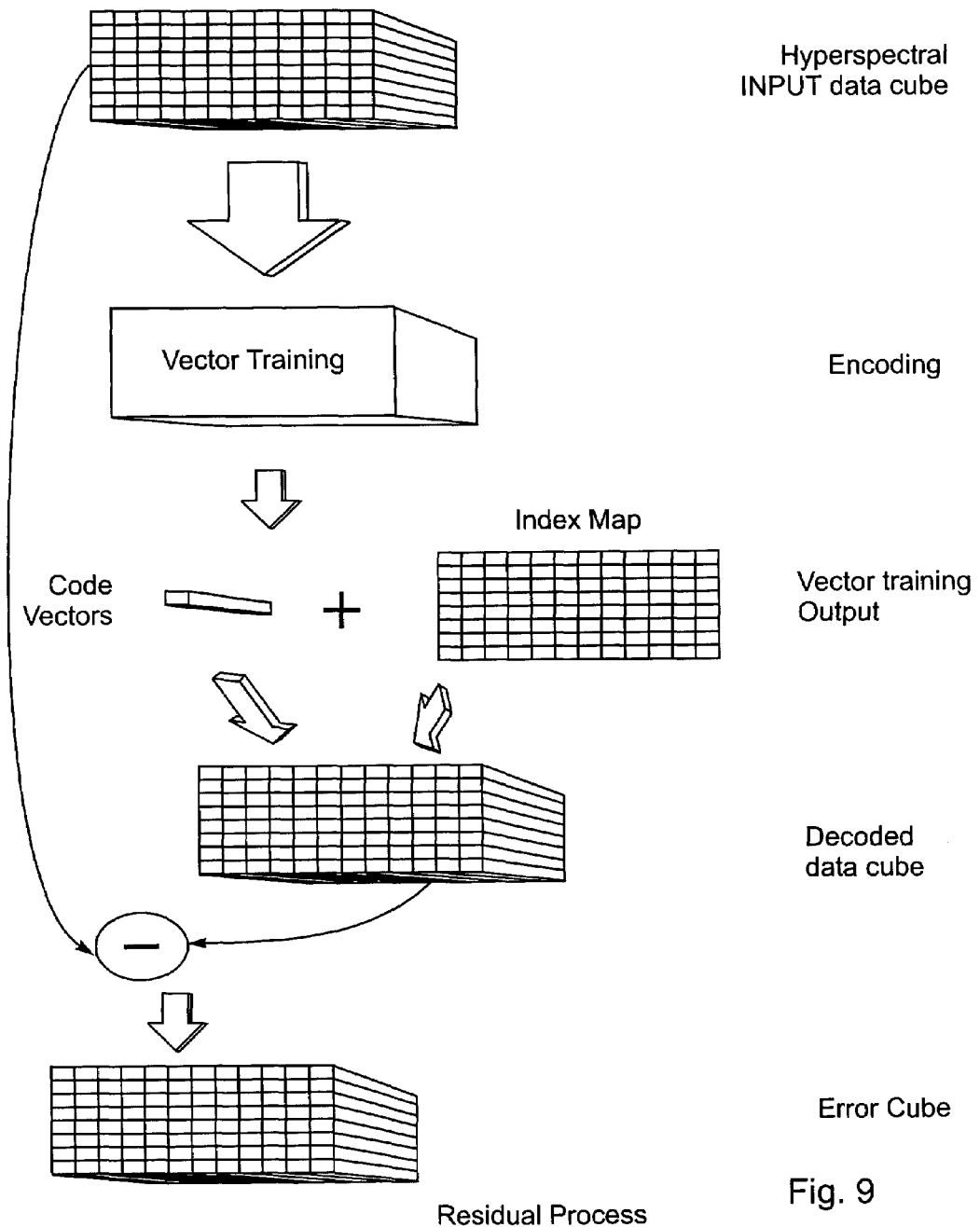
FIG. 9 is a simplified flow diagram illustrating error cube generation.
Figure 10:
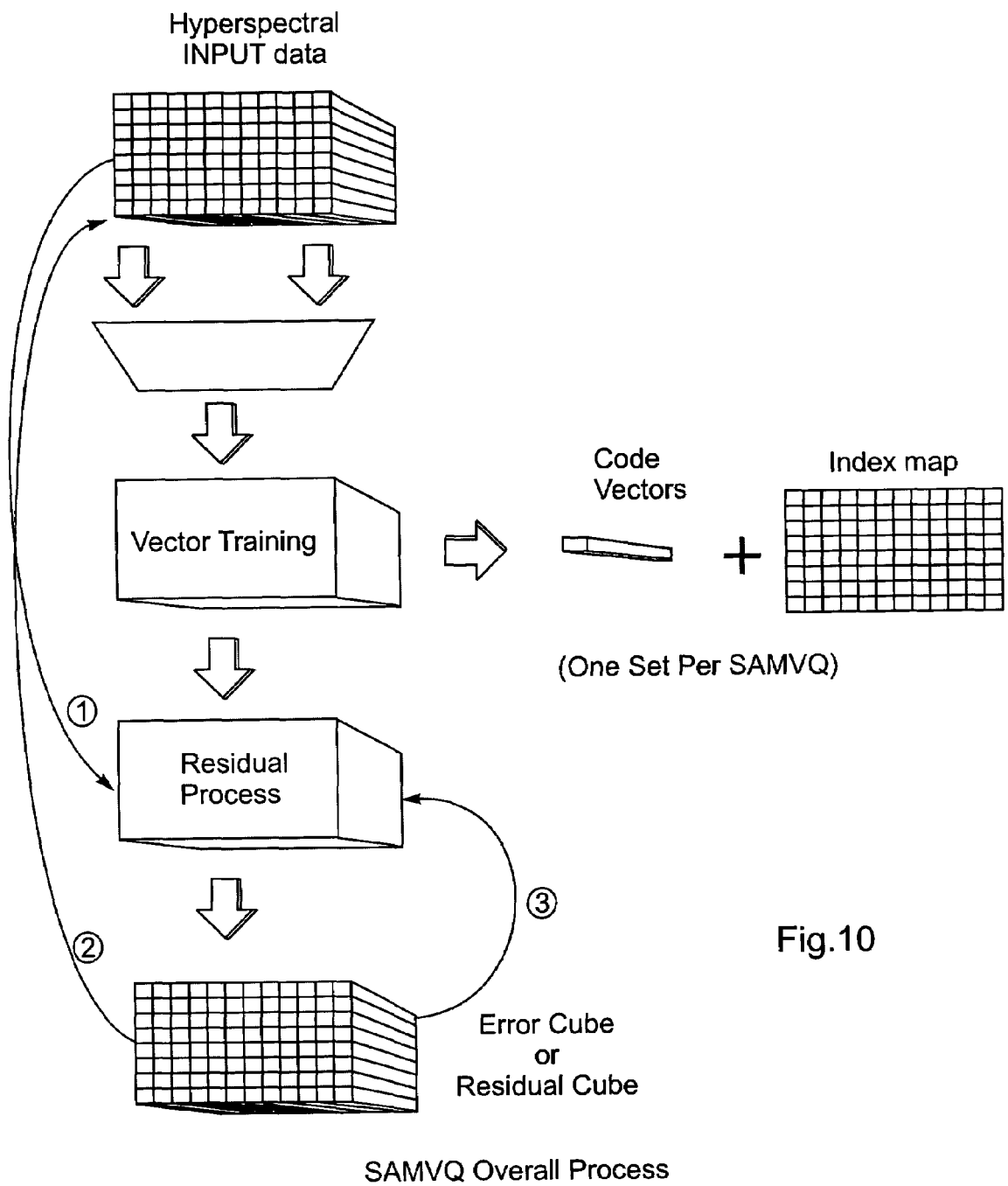
FIG. 10 is a simplified flow diagram illustrating a data compression process using the SAMVQ technique; and, FIG. 11 is a simplified flow diagram illustrating a data compression process using the HSOCVQ technique.

SAMVQ stands for Successive Approximation Multi Stage Vector Quantization. The encoded datacube after vector encoding is subtracted from the original input data cube—residual process—an error data cube is obtained as shown in FIG. 9. As the error datacube is then fed to the vector training process as input data another set of CVs and index map is generated, as shown in FIG. 10. A complete loop comprising vector training, cube reconstruction and residual process is referred to as SAMVQ stage. As shown in FIG. 10, the vector training for the first SAMVQ stage uses the hyper spectral input data. As the residual process takes place for a first time the encoded data cube is subtracted from the hyper spectral input data cube to generate an error data cube as indicated by arrow 1. When the vector training process is continued for the second SAMVQ stage the input data is the error data cube from SAMVQ stage 1, indicated by arrow 2. As the residual process is continued for the second time the encoded data cube—encoded error data cube of stage 1—is subtracted from the error data cube of the SAMVQ stage 2, indicated by arrow 3, thus generating the error data cube of the error data cube. This process is continued for subsequent SAMVQ stages. The SAMVQ compression technique is a fixed or variable number—based on, for example, Peak Signal to Noise Ratio (PSNR) criteria—of SAMVQ stages. The compressed data is represented by the CVs and index map for each SAMVQ stage. The CVs and index map for each SAMVQ stage are then sent to ground for reconstruction.

Figure 11:
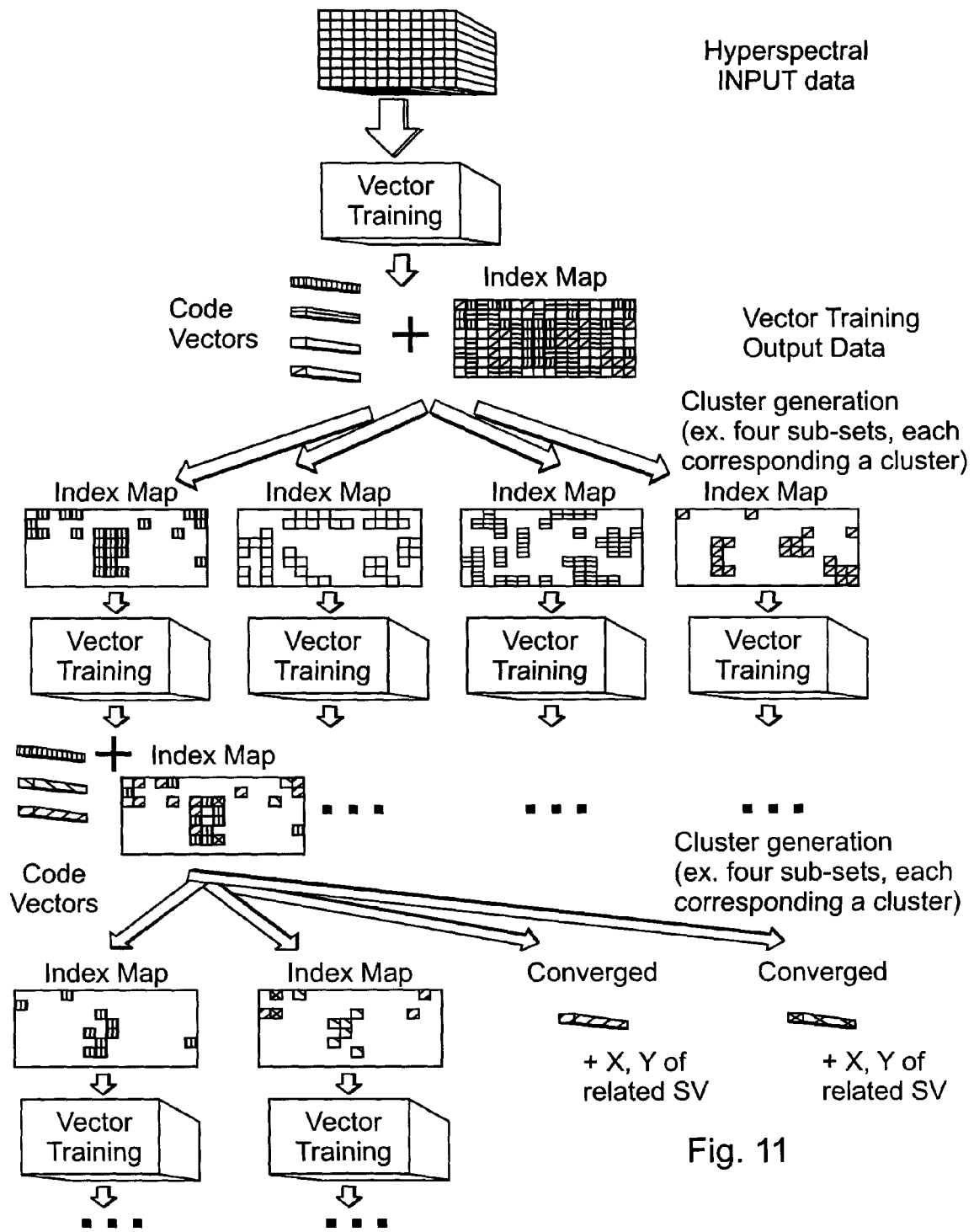

Referring to FIG. 11, a simplified flow diagram illustrating the overall HSOCVQ process is shown. The hyper spectral input data are first fed to a vector training process. The output of this block is a set of CVs—4 in the case shown in FIG. 11—and an index map specifying which CV is associated with each pixel of the input data. Each of four clusters—each cluster being associated with one CV—is then processed separately in the following stages. After the second level of vector training, the output data is again divided into 4 sub-clusters. This process is continued—tree expansion—until the clusters meet one or more of the following criteria:

1) the number of SV per cluster is smaller than a predetermined value;
2) the PSNR value of a cluster meets a pre-determined value; or
3) the Root Mean Square Error (RMSE) value of a cluster meets a pre-determined value.

As a cluster converges, the CVs determined by the vector training process in that cluster are sent to ground or temporarily stored together with an index indicative of the pixels referenced by these CVs. Eventually, all clusters converge, and the CVs and indexes related to the converged clusters are determined and sent to ground for reconstruction.

Of course, numerous other embodiments of the invention will be apparent to persons skilled in the art without departing from the spirit and scope of the invention as defined in the appended claims.

What is claimed is:

1. A compression engine comprising:
an input port for receiving input data vectors;
an output port for providing codevectors and an index map;
volatile memory in data communication with the input port and the output port for storing the input data vectors, the codevectors and the index map;
a codevector trainer in data communication with the volatile memory for training codevectors in dependence upon the input data vectors using one of along vector components codevector training or across vector components codevector training; and,
a controller in communication with the codevector trainer and the volatile memory for executing in cooperation with the codevector trainer one of Successive Approximation Multi-stage Vector Quantization (SAMVQ) or Hierarchical Self-Organizing Cluster Vector Quantization (HSOCVQ) data compression in order to produce compressed data comprising the codevectors and the index map, said controller executing said SAMVQ or HSOCVQ data compression in cooperation with the codevector trainer
wherein said codevector trainer is selected from either a matrix architecture codevector trainer training along vector components or a parallel architecture codevector trainer training across vector components, said matrix architecture codevector trainer comprising:
an input data vector memory for storing a plurality of input data vectors therein;
a codevector memory for storing j codevectors therein;
i*j vector distance calculating units forming an array of i rows and j columns, the i*j vector distance calculating units being in data communication with the input memory and the codevector memory, the i*j vector distance calculating units being for performing the steps of:
  a) receiving one component of each of i input data vectors from the input data vector memory and one component of each of the j codevectors from the codevector memory, the components corresponding to a same dimension within the vectors;
  b) determining i*j vector component distances corresponding to i*j combinations of the i input data vectors and the j codevectors;
  c) summing the successive i*j vector component distances such that each of the successive i*j vector component distances is added in a respective vector distance calculating unit of the i*j vector distance calculating units in order to determine i*j scalar vector distances; and,
  d) repeating the steps a), b) and c) for successive components;
  e) accumulating the i input data vectors in j partitions, the j partitions corresponding to the j codevectors, the i input data vectors being accumulated in dependence upon their assignment to one of the j partitions; and,
a control unit in data communication with the input data vector memory, the codevector memory, and the i*j vector distance calculating units for performing the steps of:
  controlling provision of the components of the input data vectors and the codevectors to the respective vector distance calculating units;
  determining a best match codevector for each of the i input data vectors in dependence upon the scalar vector distances;
  assigning each of the i input data vectors to one of the j partitions in dependence upon the best match codevector; and,
  updating the codevectors in dependence upon the accumulated input data vectors associated with j partitions
and wherein said parallel architecture codevector trainer comprises:
an input data vector memory for storing a plurality of input data vectors therein;
a codevector memory for storing N codevectors therein;
a vector distance calculator for determining a vectored form of a distance between an input data vector and a codevector provided thereto;
a scalar distance block for receiving the vectored form of the distance and for summing vector components of the distance in order to provide a scalar distance;
a minimal distance selector block for determining a minimum scalar distance between an input vector and the N codevectors;
N vector accumulators, each of the N vector accumulators for receiving the input data vectors associated with one of the N codevectors based upon the minimum scalar distance and for accumulating the received input data vectors;
a codebook update process block for updating the N codevectors based upon the accumulated input data vectors; and,
an exit criteria block for determining a termination of the codevector training process based upon the minimum scalar distances and a predetermined threshold.

2. A compression engine as defined in claim 1 further comprising a programming bus connected to a programming port, the codevector trainer, the controller, and the volatile memory for transmitting a control signal.

3. A compression engine as defined in claim 2 wherein the data compression is performed within the compression engine without external communication during the compression process.

4. A compression engine as defined in claim 3 comprising a clock domain decoupled from a clock domain of a system environment with which it is in communication.

5. A compression engine as defined in claim 4 wherein the hardware components of the compression engine are accommodated within a single IC.

6. A compression engine as defined in claim 5 wherein the IC is a FPGA.

7. A compression engine as defined In claim 1 wherein, for said matrix architecture codevector trainer, i*j vector component distances at a vector dimension are determined per clock cycle.

8. A compression engine as defined in claim 7 wherein the input data vectors comprise spectral vectors.

9. A compression engine as defined in claim 1 wherein said compression engine is one of a plurality of compression engines in a compressor, said compressor comprising:
   said plurality of compression engines for simultaneously compressing a plurality of data subsets of a set of input data vectors and providing compressed data thereof using one of SAMVQ or HSOCVQ data compression:
   a compressorn input port for receiving the set of input data vectors;
   an compressor output port for providing the compressed data;
   a network switch in data communication with the compressor input port, the compressor output port, and the plurality of compression engines, the network switch being for performing the steps of:
   partitioning the set of input data vectors into the plurality of data subsets;
   providing each of the plurality of data subsets to one of the plurality of compression engines; and,
   transmitting the compressed data.

10. A compression engine as defined in claim 9 wherein said compressor further comprises a programming bus connected to a programming port, the network switch, and the plurality of compression engines for transmitting a control signal.

11. A compression engine as defined in claim 9 wherein said compressor further comprises an input buffer memory in data communication with the network switch.

12. A compression engine as defined in claim 9 wherein in said compressor hardware components of each of the plurality of compression engines and the network switch are accommodated each on a single IC connected to a PCB board.

13. A compression engine as defined in claim 9 wherein said compressor further comprises a card to card connector for providing data and programming communication to a second PCB board.

14. A compression engine as defined in claim 9 wherein each of the plurality of compression engines in said compressor comprises an independent clock domain.

* * * * *